United States Patent [19]

Grawey et al.

[11] Patent Number: 5,148,077
[45] Date of Patent: Sep. 15, 1992

[54] COATING SURROUNDING A PIEZOELECTRIC SOLID STATE MOTOR STACK

[75] Inventors: Charles E. Grawey, Peoria; Kurtis C. Kelley, Washington, both of Ill.

[73] Assignee: Caterpillar Inc., Peoria, Ill.

[21] Appl. No.: 589,850

[22] Filed: Sep. 28, 1990

[51] Int. Cl.$^5$ ............................................. H01L 41/08
[52] U.S. Cl. .................................... 310/328; 310/340; 310/345
[58] Field of Search ............... 310/323, 328, 366, 345, 310/340

[56] References Cited

U.S. PATENT DOCUMENTS

| | | | |
|---|---|---|---|
| 3,501,099 | 3/1970 | Benson | 310/328 |
| 3,683,211 | 8/1972 | Perlman et al. | 310/340 X |
| 4,011,474 | 3/1977 | O'Neill | 310/328 |
| 4,038,570 | 7/1977 | Durley, III | 310/323 |
| 4,051,396 | 9/1977 | Berlincourt | 310/340 |
| 4,193,009 | 3/1980 | Durley, III | 310/323 |
| 4,231,287 | 11/1980 | Smiley | 310/328 |
| 4,382,243 | 5/1983 | Babitzka et al. | 335/219 |

FOREIGN PATENT DOCUMENTS 0319038 2/1988 European Pat. Off. .

OTHER PUBLICATIONS

"Large Size Metal Case Type Piezoelectric Actuator", NEC Technical Report vol. 11, No. 4, 1989, pp. 49–53.
*Piezoelectric Materials* (Physics International Company. Date Unknown).

*Primary Examiner*—Mark O. Budd
*Attorney, Agent, or Firm*—Sterne, Kessler, Goldstein & Fox

[57] ABSTRACT

An encapsulated piezoelectric solid state motor stack having a plurality of piezoelectric disks interleaved with a plurality of electrodes. A first elastomer is used for encapsulating the stack to prevent arc-over. A second elastomer is used for encasing the combination of the encapsulating elastomer and the stack. An elastomer grease is sandwiched between the encapsulating elastomer and the encasing elastomer for reducing friction between the combination and the encasing elastomer. The friction is induced by an axial displacement produced between first and second end surfaces of the stack when the electrodes are biased by a source of electrical potential. The structure also includes a protective housing including and a diaphragm. The housing cylindrically encases the combination of the stack, the encapsulating elastomer, the elastomer grease and the encasing elastomer, and the and one end thereof. The diaphragm is attached to the housing for encasing the other end of the combination.

10 Claims, 6 Drawing Sheets

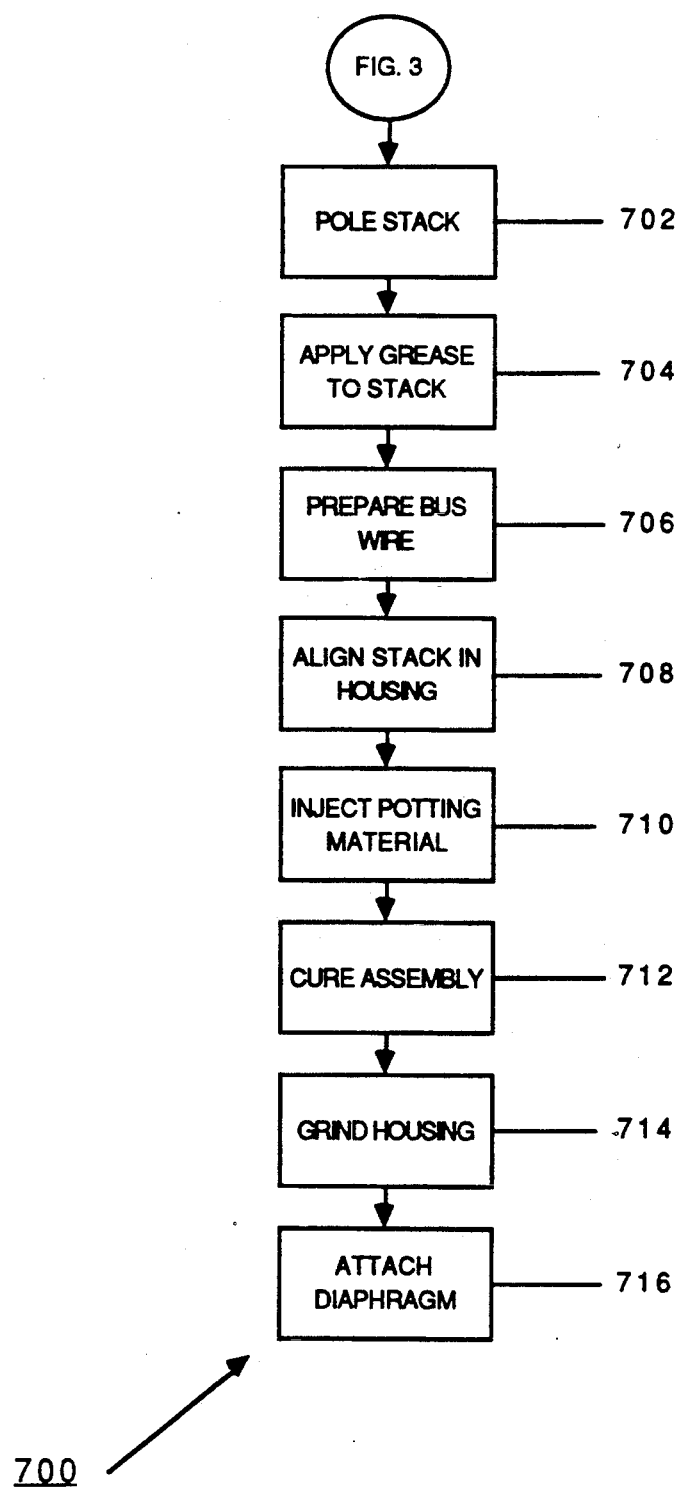

COATING SURROUNDING A PIEZOELECTRIC SOLID STATE MOTOR STACK

BACKGROUND OF THE INVENTION

1. Field of the Invention

The field of the invention relates generally to an encapsulation structure for solid state motor actuators, and more particularly to a process for encapsulating piezoelectric solid state motor stacks.

2. Related Art

For decades electroexpansive materials have been employed in stacked structures for producing actuation used for fuel injection and valve control in diesel engines, for example. Commercially manufactured solid state motor stacks, or actuators, are produced using piezoelectric disks interleaved with metal foil electrodes. Application of high voltage, low current power to alternately biased electrodes causes each of the piezoelectric disks to expand or axially distort. The additive deflection of the stacked disks is typically amplified by hydraulics to effectuate useful actuation.

An example of a conventional electromechanical actuator having an active element of electroexpansive material is found in U.S. Pat. No. 3,501,099 to Glendon M. Benson. Benson's 1970 patent is directed to both an actuation amplification structure and a method for manufacturing piezoelectric stacks. Sheets of ceramic material are rolled, compacted and punched into ceramic disks. After a cleaning process, the disks are stacked with alternate sets of continuous disk electrodes disposed between the ceramic disks. The stacks undergo a pressurized cold-welding process, followed by an elevated temperature and pressure bonding process after common electrodes are connected to the two electrode groups. The stacks are poled by application of a DC voltage and then encapsulated with a plastic insulative cover prior to final mounting within a transducer housing.

Another conventional method uses epoxy to bond lead zirconium titanate (PZT) ceramic discs together, interleaved with metal foil electrodes. The epoxy used in this process has a lower modulus of elasticity than the ceramic and acts as a compliant layer in the bonded stack structure, thus reducing the additive displacement during actuation.

A modified technique for preparing piezoelectric disks includes a two-stage press/lap manufacturing process. After punching or individually compressing the disks, the thickness of each disk is reduced by lapping. Piezoelectric disk thicknesses are limited to approximately 0.254 mm by this process and require high voltage to generate lattice distortion. Higher driving voltages necessitate larger, more expensive power generation circuits. In turn, the delivery of the higher voltage to the stack imposes wiring harness and connector design difficulties. Moreover, the larger power circuits generate additional heat which must be removed from the engine. These tradeoffs plague stack design and drive up the cost of systems using stacks to actuate valves or injection controls, for example.

Moreover, the ability to mass produce stacks is limited by the time and cost of manufacturing the disks themselves. Conventional punching or compressing combined with lapping/polishing results in low disk yield due to the time elements of the two step process and disk breakage during the lapping step.

Various environmental design considerations are important in piezoelectric stack manufacturing. Device operating temperature ranges and external mechanical stresses are the most serious of these factors.

Conventional stacks are limited to a maximum operating temperature of about 75° celsius, measured at the outside of the stack housing. Heat generated by the stack itself is compounded by the extreme heat generated by the engine upon which the housed stack is typically mounted. Stack temperatures can reach upward of 40°-50° C. above the measured engine temperature.

On the other hand, structural defects typically lead to conventional stack failure due to shear and torsional stresses applied to the stack during operation and/or installation. Structural stack failure is most commonly attributed to fatigue cracking of the ceramic disks. Separation between disks/electrodes is also a frequent problem.

Piezoelectric stack insulation has been introduced between the disk/electrode stack and the housing in an attempt to minimize some of the above mentioned problems.

U.S. Pat. No. 4,011,474 to Cormac G. O'Neill discloses several methods for improving stack insulation to avoid operation breakdowns. Arc-over is allegedly avoided by maintaining contact between the piezoelectric stack and the insulating material. In a first embodiment, O'Neill teaches introducing a pressurized insulating fluid such as oil, into the housing of a piezoelectric stack. The fluid is pressurized so as to maintain contact between the fluid and the stack during radial shrinkage, or axial expansion, upon the application of an applied voltage.

In a second embodiment, O'Neill applies a solid polyurethane coating to the stack. The coating is kept in contact with the stack by a pressurized insulating fluid to prevent separation during operation and arc-over associated therewith.

A third O'Neill embodiment maintains contact between the stack and a solid insulating coating by winding a filament or tape around the coated stack. The tape is wound around the coating to preload the coating to prevent separation of the coating from the stack. The winding of the tape is spaced to allow for expansion of the polyurethane coating during operation of the stack.

The present invention constitutes an improvement over conventional encapsulation technology. Benefits, such as increased stack operational temperature range, endurance, output, and lifetime, are achieved by the present invention.

SUMMARY OF THE INVENTION

The present invention is directed to an encapsulated piezoelectric solid state motor stack having a plurality of piezoelectric disks interleaved with a plurality of electrodes. A first elastomer is used for encapsulating the stack to prevent arc-over. A second elastomer is used for encasing the combination of the encapsulating elastomer and the stack. An elastomer grease is sandwiched between the encapsulating elastomer and the encasing elastomer for reducing friction between the combination and the encasing elastomer. The friction is induced by an axial displacement produced between first and second end surfaces of the stack when the electrodes are biased by a source of electrical potential.

The structure also includes a protective housing and a diaphragm. The housing cylindrically encases the combination of the stack, the encapsulating elastomer, the elastomer grease and the encasing elastomer. The housing also encases one end of the combination. The diaphragm is attached to the housing for encasing the other end of the combination.

The present invention is also directed to a method for encapsulating a piezoelectric solid state motor stack having a plurality of disks interleaved with electrodes. The method includes the step of encapsulating the stack with a first material, followed by encasing the combination of the first material and the stack within a protective housing, and then sandwiching a lubricant between the combination and the protective housing for reducing friction between the combination and the protective housing.

BRIEF DESCRIPTION OF THE DRAWINGS

The invention will be better understood if reference is made to the accompanying drawings in which:

FIG. 7 is a flow chart of the basic steps in a method for the final housing assembly of a piezoelectric stack in connection with the present invention.

DETAILED DESCRIPTION OF THE PREFERRED EMBODIMENTS

Broadly, the present method for encapsulating piezoelectric stacks is designed for an automated manufacturing process to yield high-quality, high-durability solid state motor stacks in great volume. The piezoelectric encapsulation steps of the present process have refined the technology by employing careful cleaning and inspection operations which result in stacks that can displace 0.13% in fast response times of 100 microseconds, and produce driving forces greater than 35 MPa. Unlike conventional piezoelectric solid state motor stacks, which have relatively limited temperature ranges, stacks encapsulated according to the present invention have an extended operational temperature range between about −40° C. and +100° C. (measured externally; plus an additional 40° to 50° C. measured internally).

Encapsulated piezoelectric solid state motor stacks of the present invention are high-force devices that can be used to improve engine performance, reduce emissions, and reduce engine noise. The utility of the present invention is not, however, limited to encapsulating stacks for engine valve and fuel injector actuation. Encapsulated stacks of the present invention may be used in brake or shock absorbing systems, for example. Moreover, the invention may be used to encapsulate a wide variety of devices or systems which operate in high temperature, or otherwise extreme environments.

It should be understood that the present invention is directed to a piezoelectric solid state motor stack encapsulation structure and the method of encapsulating the stack structure. However, the terms solid state motor stack and electroexpansive actuator, for example, are synonymous. Throughout this discussion, the piezoelectric solid state motor stacks will be commonly referred to as "stacks."

Figure 1:
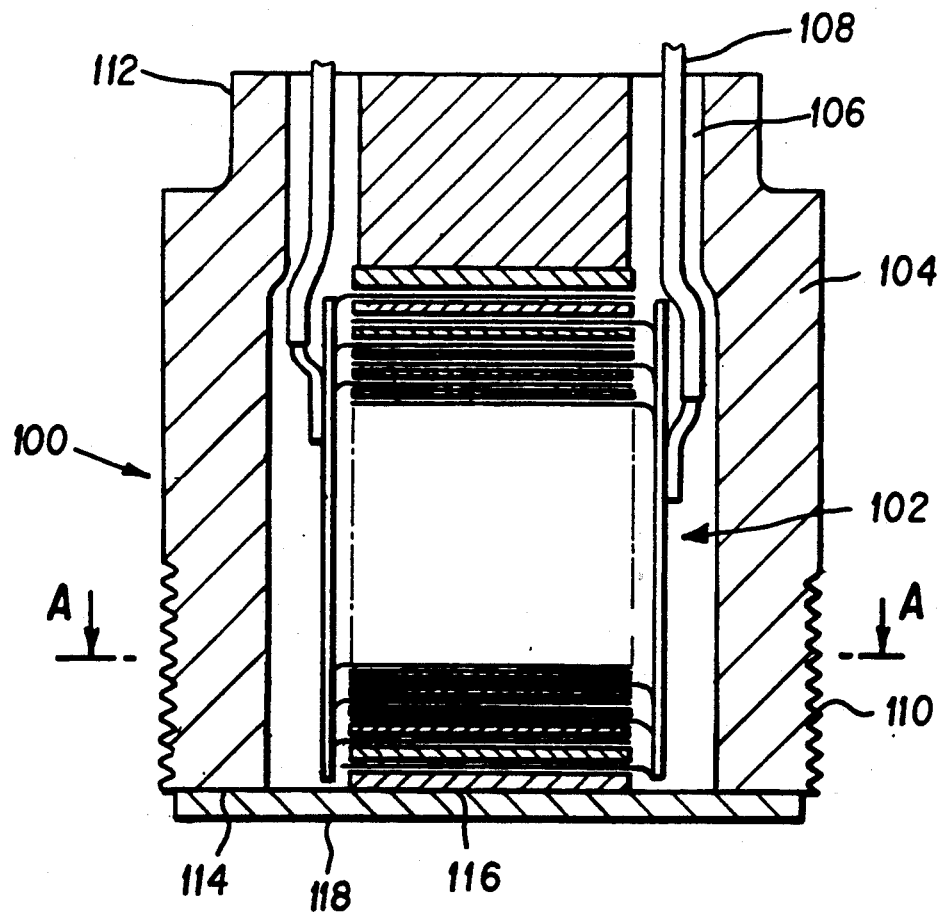
FIG. 1 shows a side-sectional view of a housed, encapsulated piezoelectric solid state motor stack in connection with the present invention.

FIG. 1 shows an encapsulated solid state motor stack, 100, in connection with the present invention. An electrode/ceramic disk stack 102 is centered in a housing 104. The steel case, or housing 104, is cylindrical in shape with a hollow cylindrical cavity for housing the solid state stack. Throughports 106 are bored in the top end of the housing to permit bus lead wires 108 to exit the housing. Threads 110 attach the piezoelectric solid state motor housing to an engine head. Plateau 112 represents a hexagonal cross section, if viewed from the top of FIG. 1. This hexagonal structure is not shown in the figure, but is used for tightening and loosening the piezoelectric solid state motor housing on the engine head.

The preferred embodiment of the assembled piezoelectric solid state electrode/disk stack 102 is described in the concurrently filed commonly assigned co-pending application Ser. No. 07/589,855 filed Sep. 28, 1990, titled "Piezoelectric Solid State Motor Stack", the entire disclosure of which is incorporated herein by reference.

Figure 2:
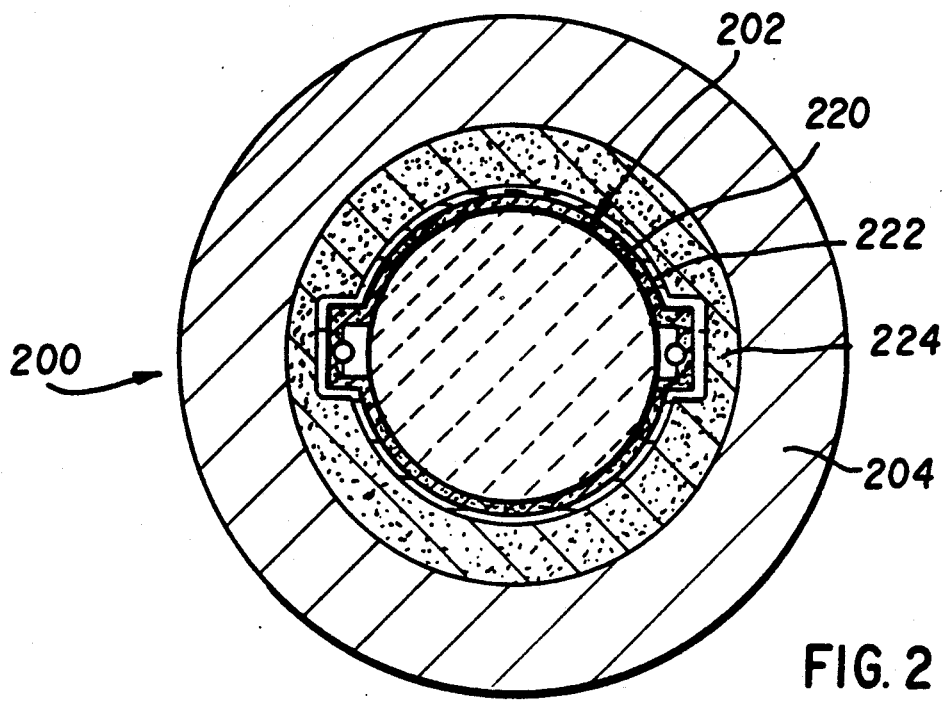
FIG. 2 shows a top-sectional view of the housed piezoelectric stack of FIG. 1 taken through line A—A.

FIG. 2 is a cross-sectional view taken through line A—A of the piezoelectric solid state motor stack and housing of FIG. 1. The details of FIG. 2 will be covered during the following discussion of the encapsulation process.

Figure 3:
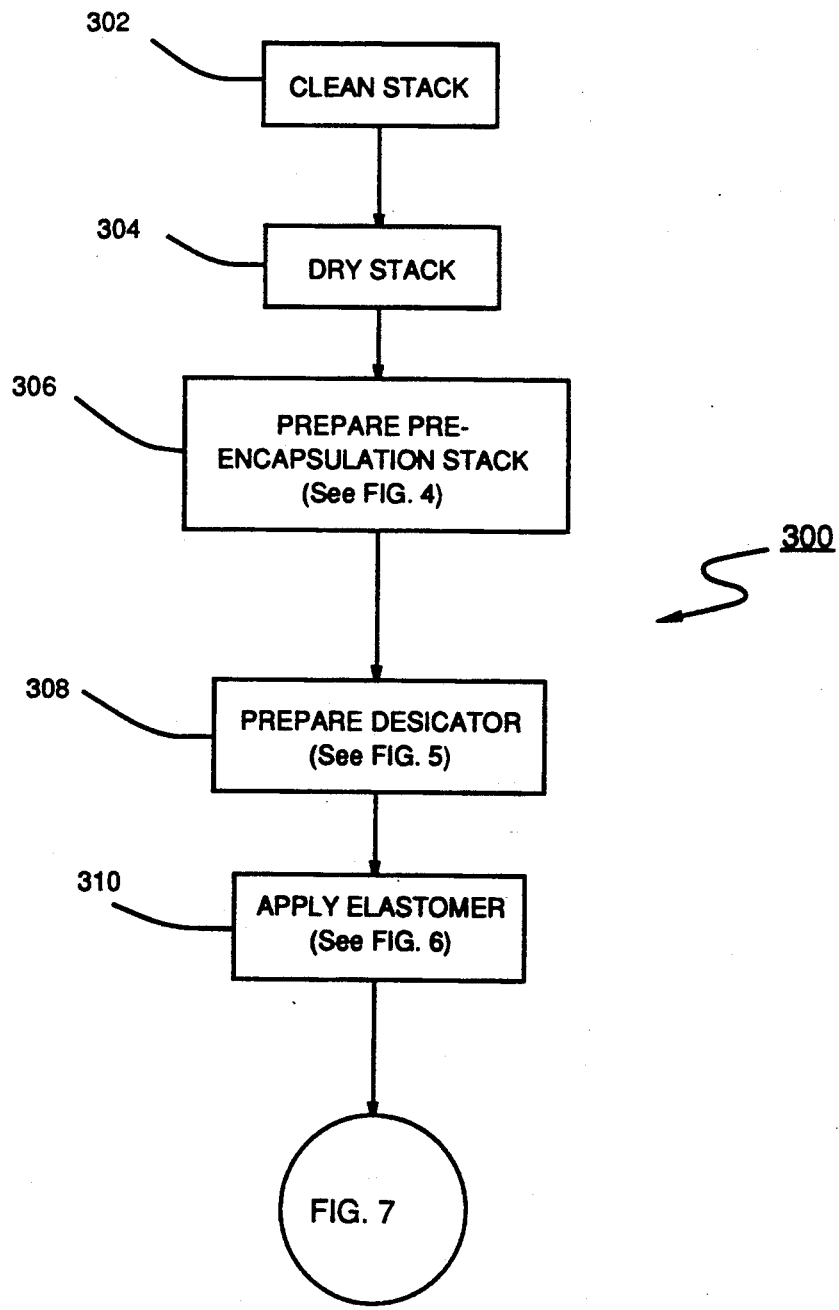
FIG. 3 is a flow chart of the basic steps in a method for encapsulating a piezoelectric stack in connection with the present invention.

A generalized stack encapsulation process 300 is shown in FIG. 3. As shown at block 302, the stack undergoes a cleaning process. In one embodiment, excess gloss and contaminants are removed from the exterior of the assembled stack and bus bar structure by a conventional grit blasting technique. The stack is ultrasonically cleaned in a methanol bath. The cleaned stack is then heat dried at block 304.

Figure 4:
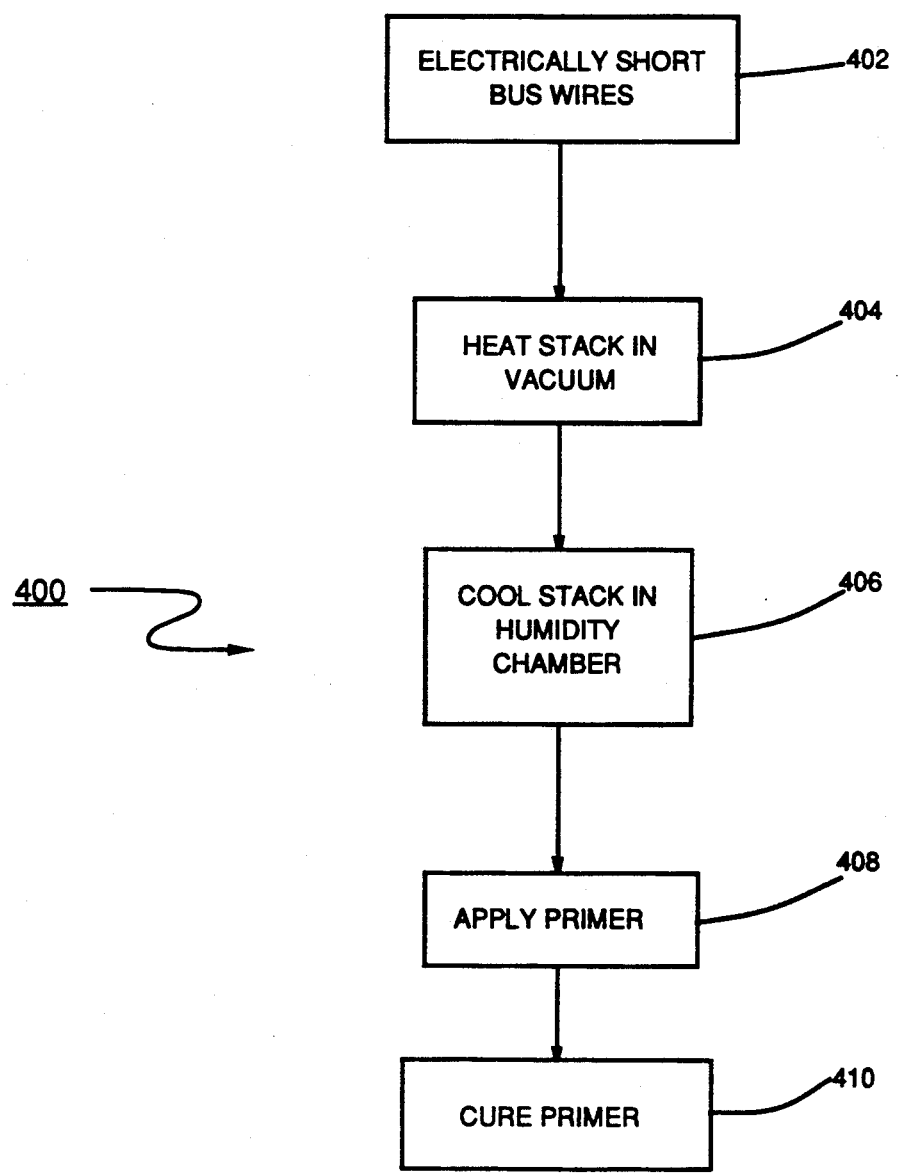
FIG. 4 is a flow chart of the basic steps in a method for pre-encapsulation preparation of a piezoelectric stack in connection with the present invention.

Block 306 represents a series of pre-encapsulation steps. This pre-encapsulation process 400 is shown in more detail at FIG. 4. The bus wires are electrically shorted at block 402 to prevent electrostatic charging of the stack, because of its inherent capacitive characteristics. The stack is then placed in a conventional vacuum desiccator fixture to remove volatile contaminants, as shown at block 404. The stack is then cooled before applying a primer, as indicated at 406, and in accordance with primer manufacturer instructions.

A coating of primer is applied to the exterior of the stack and bus bar structure at block 408 in preparation for the silicone coating process. Dow Corning SilGuard Primer No. 1200 or an equivalent may be used. The primer is cured (at block 410) in accordance with conventional curing techniques, according to manufacturer specifications.

Figure 5:
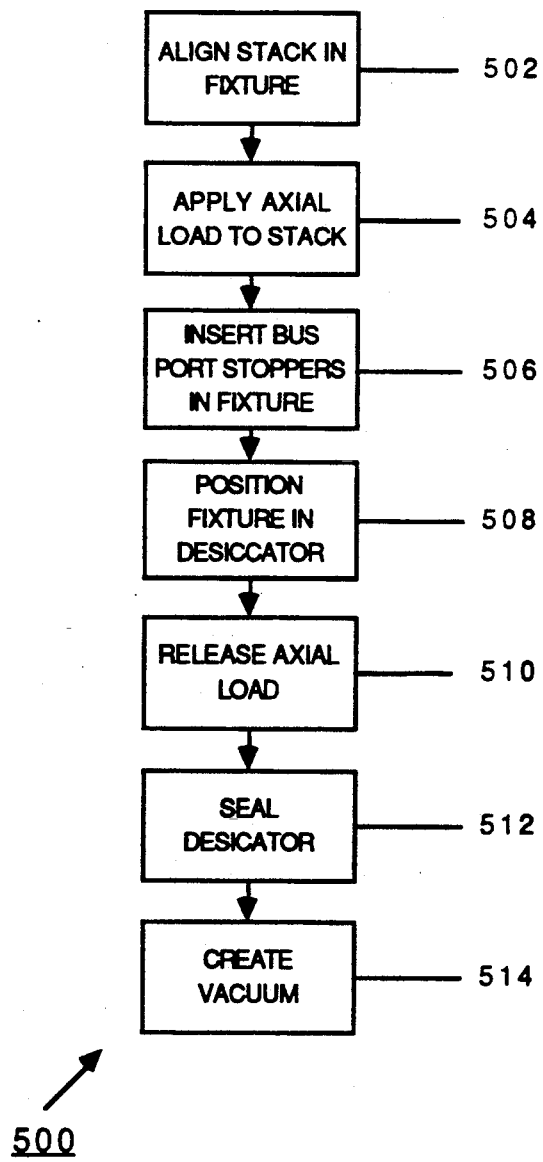
FIG. 5 is a flow chart of the basic steps in a method for preparation of a desiccator for use in the encapsulation of a piezoelectric stack in connection with the present invention.

The details of the desiccator preparation step of block 308 in FIG. 3 are shown at process 500 of FIG. 5. The stack is aligned in a modified alignment fixture at block 502 such that a small axial compressive load can be applied to the stack as shown at block 504. The alignment fixture should comprise a cylindrical case including a bottom/end section and a load screw for applying an axial compression to the stack. The bottom has two openings to permit the bus leads to pass therethrough. In addition, the inner diameter of the alignment fixture case should be slightly larger than the outside diameter of the stack in order to permit proper encapsulation. Stoppers must then be inserted in the holes at the base of the alignment fixture to seal around the bus bar leads. The composition of the alignment fixture case and port stoppers is not crucial to the invention. However, their composition must not be such that contamination of the stack or chemical reactions occur therewith.

The prepared alignment fixture is then positioned in the vacuum desiccator as shown at block 508. The axial load is released and the desiccator is then sealed as shown at blocks 510 and 512, respectively. A vacuum is then created in the desiccator as shown at block 514, to draw out a sufficient volume of air so that the elastomer will fill the voids in the stack when the vacuum is released.

Figure 6:
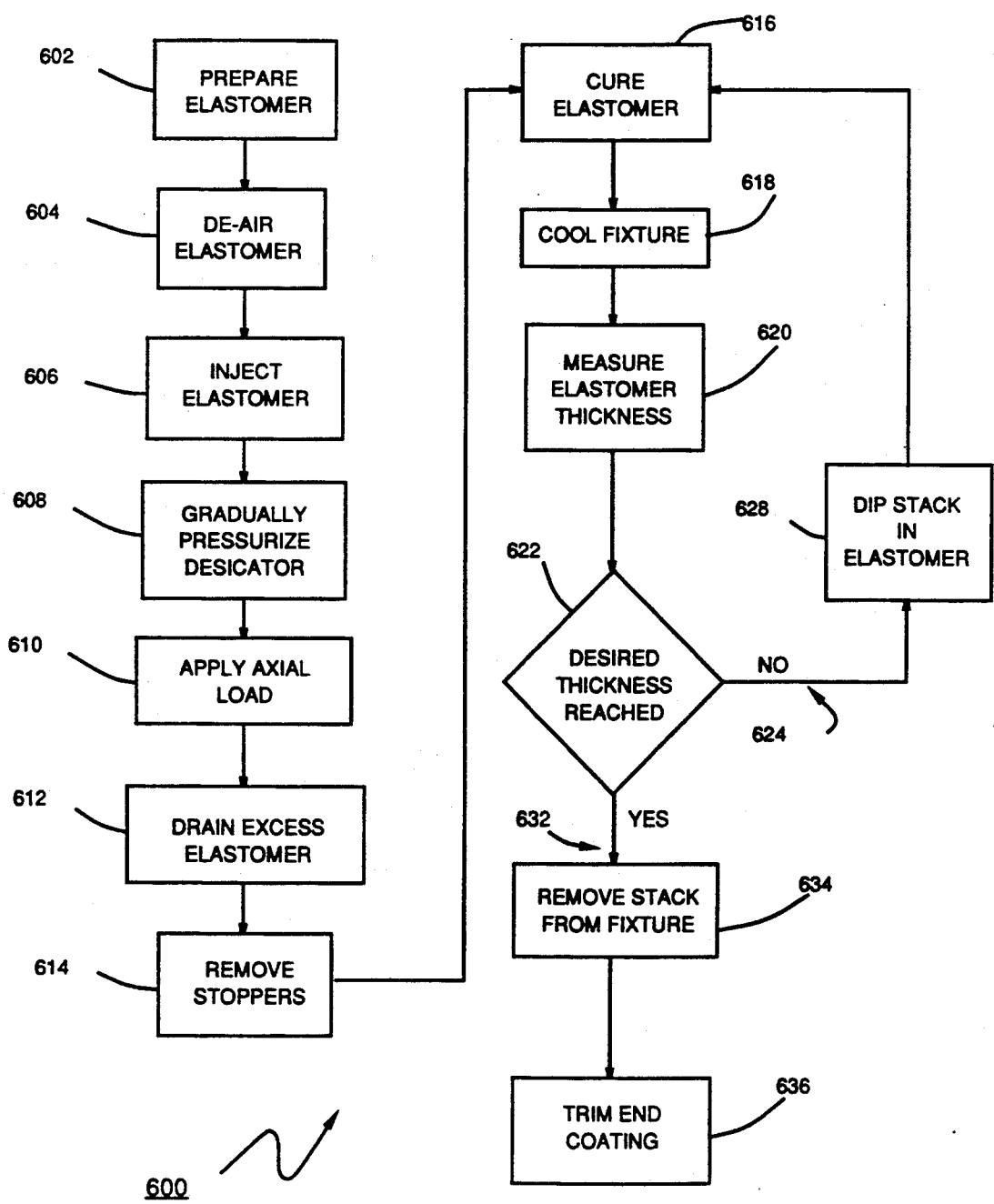
FIG. 6 is a flow chart of the basic steps in a method for applying an elastomer in the encapsulation of a piezoelectric stack in connection with the present invention.

The application of an elastomer, shown in block 310 in FIG. 3 will be described in further detail with reference to process 600 in FIG. 6. A silicone elastomer, Dow Corning SilGuard 184, for example, is mixed as per the manufacturer's suggested directions. This preparation is shown at block 602. The silicone elastomer mix is then injected into the desiccator through a glass tube and then into the spaces between the stack and the inside wall of the alignment fixture case as shown at 606. The vacuum desiccator is then gradually pressurized, and an axial load of at least about 1500 psi is applied to the stack by the load screw attached to the assembly fixture case as shown at blocks 608 and 610, respectively.

As shown at blocks 612 and 614, respectively, the excess silicone elastomer is drained from the alignment fixture and the stoppers removed. The silicone elastomer encapsulant is then cured in an oven, as shown at block 616.

In the presently preferred embodiment, curing is accomplished at about 65° C. for approximately 4 hours. The present inventors have found that curing time is inversely proportional to the curing temperature and that the maximum cure temperature is approximately 100° C. More significantly, the inventors have found that cure temperature at this stage directly affects the minimum operating temperature of the motor stack. They have found that the lower the cure temperature, the lower the minimum operating temperature that they can achieve.

The fixture is then allowed to cool as shown at block 618 and the elastomer thickness measured as shown at 620. A determination is made, see block 622, whether the desired thickness of the silicone elastomer encapsulant has been reached. This determination is based on whether the bus bar and tab structures are sufficiently covered so as to prevent arc-over. If the desired thickness is not reached as indicated at 624, the stack is then dipped in elastomer as shown at block 628. Steps 616, 618, 620, 622 and 628 are repeated until the desired thickness is reached as shown at 632. The stack is then removed from the fixture as shown at block 634.

The two end coatings of silicone elastomer encapsulant are trimmed, as shown at 636. Once trimmed, the layer of silicone elastomer, shown at 220 of FIG. 2, coats the cylindrical surface of the assembled stack 202, as well as the bus bar and electrode tab structure. Trimming exposes the end surfaces of the assembled stack to permit direct transfer of translational motion from the stack to a diaphragm member during actuation. Otherwise, the untrimmed end coating of elastomer would act as a compliant layer.

The sequence at 700 of FIG. 7 represents the final assembly of the stack in the housing. Poling of the stack, as shown at block 702, is done once the stack is assembled, in accordance with guidelines provided by the ceramic manufacturer. In the presently preferred embodiment, poling is done at an elevated temperature, for example 145° C. The poling voltage signal is applied to the stack in three stages. During the first stage a 0-volt to 1200-volt charge is applied linearly. This voltage is held constant during the second stage. Finally, at the third stage the voltage is linearly reduced to 0-volts during a five-minute period. The stack is then cooled to room temperature. The poling technique is conventional and is a function of the ceramic material used.

Referring again to FIG. 2, a thin coat of Dow Corning silicone vacuum grease 222 is applied to the surface of the silicone elastomer encapsulant 220. Enough grease should be applied to prevent adhesion of the silicone encapsulant 220 to potting material 224. The application of the grease to the stack is shown at block 704.

As depicted by 706, the bus wires are soldered to the bus bars and a layer of shrink-wrap tubing is applied as an insulator.

The coated, assembled stack is then inserted into housing 104 and centered. Once in position, a potting material is injected into the cavity between the stack and the housing (a thickness of approximately 4–5 mm). See block 710. In addition, the potting material's thermoconductive characteristics should be sufficient to conduct heat generated by the stack to the inside of the housing wall. Emerson Cummings Eccosil Model 5954 is preferred for the potting material, because it includes aluminum oxide for enhanced thermal conductivity. The potting material is cured according to conventional techniques, as shown at block 712.

In FIG. 2, the potting material is shown at numeral 224, sandwiched between the grease 222 and the inner cylindrical surface of housing 204. Again, the silicone elastomer encapsulant is shown at 220. Silicone grease coating is shown at 222. Finally, silicone potting material is shown at 224.

As shown in block diagram 714, surface 114 of housing 104 and the exposed surface of ceramic end cap 116 must be simultaneously ground to facilitate proper alignment of steel diaphragm 118 to the end of the stack housing assembly. The diaphragm 118 may then be laser-welded to surface 114 of housing 104 as depicted at 716.

The diaphragm is preferably made of stainless steel and has a thickness of about 0.25 mm. The steel diaphragm functions to protect the stack from external contaminates. In addition, the diaphragm prevents the electrode/disk stack from rotating within the housing.

Typically, a piston or spring is abutted against the bottom of the stack when the housed stack is installed on an engine head, for example. During installation, the housed stack is screwed onto the engine head and the diaphragm transfers stresses to the housing. If no diaphragm were present, the friction between the ceramic end-cap of the stack and the piston would cause the stack to rotate. Rotation of the stack would in turn cause disks to shear, and separate, and the silicone encapsulant would rupture. Such structural defects would detrimentally affect stack operation.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

We claim:

1. An encapsulated piezoelectric solid state motor stack having a plurality of disks interleaved with electrodes, comprising:
   first means for encapsulating the stack;
   second means for encasing the combination of said first means and the stack; and
   third means sandwiched between said first and second means for reducing friction between said combination and said second means induced by an axial displacement produced between first and second end surfaces of the stack when the electrodes are biased by a source of electrical potential.

2. An encapsulated piezoelectric solid state motor stack according to claim 1, wherein said first means comprises an elastomer.

3. An encapsulated piezoelectric solid state motor stack according to claim 2, wherein said first elastomer comprises silicone.

4. An encapsulated piezoelectric solid state motor stack according to claim 1, wherein said second means comprises:
   an elastomer surrounding said combination and said third means; and
   a protective housing including a diaphragm, wherein said housing cylindrically encases said combination and said third means and one end thereof, said diaphragm being attached to said housing for encasing the other end of said combination.

5. An encapsulated piezoelectric solid state motor stack according to claim 4, wherein said elastomer comprises silicone and aluminum oxide to enhance the thermal conductivity of said silicone.

6. An encapsulated piezoelectric solid state motor stack according to claim 1, wherein said third means comprises a grease.

7. An encapsulated piezoelectric solid state motor stack according to claim 6, wherein said grease comprises silicone.

8. An encapsulated piezoelectric solid state motor stack according to claim 2, wherein said second means comprises:
   a metal housing; and
   a second elastomer comprising silicone and aluminum oxide to enhance the thermal conductivity of said silicone.

9. An apparatus for encapsulating and protecting a piezoelectric solid state motor stack having a plurality of disks interleaved with a first and second plurality of electrodes, the first and second plurality of electrodes being interconnected with first and second bus bars, respectively, to thereby produce an axial displacement between first and second end surfaces of the stack when the electrodes are biased by the source of electrical potential, the apparatus comprising:
   (a) first means for substantially encapsulating a first combination of the stack, electrodes and bus bars, said first means being in direct contact with exposed surface areas of said first combination to prevent arc-over when the electrodes are biased by the source of electrical potential;
   (b) second means for encasing a second combination of said first means and said first combination, said second means comprising:
      (i) an elastomer surrounding said second combination; and
      (ii) a protective housing for cylindrically encasing said second combination and said elastomer; and
   (c) third means located between said first and second means for reducing friction between said second combination and said second means induced by the axial displacement produced between the first and second end surfaces of the stack when the electrodes are biased by the source of electrical potential.

10. An apparatus according to claim 1, wherein said first means comprises an elastomer substantially encapsulating, and in direct contact with the stack to prevent arc-over when the electrodes are biased by a source of electrical potential.

* * * * *